United States Patent [19]
Brandolf et al.

[11] Patent Number: 4,783,579
[45] Date of Patent: Nov. 8, 1988

[54] FLAT MULTI-CONDUCTOR POWER CABLE WITH TWO INSULATING LAYERS

[75] Inventors: Henry E. Brandolf, Miller Place, N.Y.; Paul C. Schubert, Jr.; Axel V. Walsen, both of Harrisburg, Pa.

[73] Assignee: AMP Incorporated, Harrisburg, Pa.

[21] Appl. No.: 857,211

[22] Filed: Apr. 29, 1986

[51] Int. Cl.⁴ .................... H01B 17/08; H01B 13/14
[52] U.S. Cl. .................. 174/117 FF; 156/55; 156/56; 174/120 AR; 174/120 SR; 264/174
[58] Field of Search ......... 174/117 R, 117 F, 117 FF, 174/110 SR, 110 AR, 110 V, 120 AR, 120 SR; 264/174; 156/55, 56

[56] References Cited

U.S. PATENT DOCUMENTS

| | | | |
|---|---|---|---|
| 2,628,998 | 2/1953 | Friskie | 174/112 |
| 3,013,109 | 9/1961 | Gorman et al. | 174/113 |
| 3,168,617 | 2/1965 | Richter | 74/117 FF |
| 3,600,500 | 8/1971 | Schoerner et al. | 174/115 |
| 3,720,778 | 3/1973 | Woertz et al. | 174/117 F X |
| 3,735,022 | 5/1973 | Estep | 174/117 F |
| 3,828,120 | 8/1974 | Hansen | 174/117 |
| 3,960,430 | 6/1976 | Bunnell et al. | 339/97 C |
| 3,985,948 | 10/1976 | Olszewski et al. | 174/28 |
| 4,096,346 | 6/1978 | Stine et al. | 174/36 |
| 4,104,481 | 8/1978 | Wilkenloh et al. | 174/102 R X |
| 4,107,354 | 8/1978 | Wilkenloh et al. | 174/102 R X |
| 4,219,928 | 9/1980 | Kuo | 174/117 FF X |
| 4,238,260 | 12/1980 | Washkewicz | 138/126 X |
| 4,240,687 | 12/1980 | Bunnell et al. | 339/99 R |
| 4,240,688 | 12/1980 | Sotolongo | 339/122 F |
| 4,248,990 | 2/1981 | Pieski et al. | 525/360 X |
| 4,263,474 | 4/1981 | Tennont | 174/84 C |
| 4,283,593 | 8/1981 | Piasecki et al. | 174/36 |
| 4,292,463 | 9/1981 | Bow et al. | 174/107 |
| 4,308,421 | 12/1981 | Bogese, II | 174/32 |
| 4,319,075 | 3/1982 | Willette | 174/117 FF |
| 4,346,145 | 8/1982 | Choi et al. | 428/389 |
| 4,380,252 | 4/1983 | Gray et al. | 138/132 X |
| 4,417,096 | 3/1983 | Willette | 174/71 R |
| 4,447,378 | 5/1984 | Gray et al. | 138/149 X |
| 4,463,998 | 8/1984 | Reavis et al. | 339/40 |
| 4,467,138 | 8/1984 | Brorein | 174/115 |
| 4,468,089 | 8/1984 | Brorein | 156/55 X |
| 4,472,598 | 9/1984 | Boyd et al. | 174/113 |
| 4,481,379 | 11/1984 | Bolick et al. | 174/36 |
| 4,487,997 | 12/1984 | Ditchfield | 174/115 |
| 4,676,850 | 6/1987 | Strauss et al. | 156/55 |
| 4,695,679 | 9/1987 | Strauss et al. | 174/117 FF |

FOREIGN PATENT DOCUMENTS

| | | | |
|---|---|---|---|
| 415572 | 5/1936 | Belgium. | |
| 1465784 | 5/1964 | Fed. Rep. of Germany | 215/174 |
| 2555908 | 6/1977 | Fed. Rep. of Germany. | |
| 2911650 | 9/1980 | Fed. Rep. of Germany | 174/117 F |
| 7322707 | 6/1973 | France. | |
| 580992 | 7/1933 | German Democratic Rep.. | |
| 132703 | 10/1981 | Japan. | |
| 1386065 | 3/1975 | United Kingdom | 174/117 F |

OTHER PUBLICATIONS

Hubbell System PDC Application Installation Manual, 28 pages, published prior to Jul. 1984, p. 4.
Wiremold ® Fanton Flex ™ Undercarpet Wiring Systems, 12 pages, 1982, p. 4.

Primary Examiner—Morris H. Nimmo
Attorney, Agent, or Firm—Katherine A. Nelson

[57] ABSTRACT

A flat multi-conductor power cable is disclosed which includes a plurality of generally parallel, spaced apart, flat conductors which are surrounded by two layers of insulation material. An internal layer is extruded around each of the flat conductors and is intimately bonded to each conductor. A single external layer is extruded around all of the internal layers and is intimately joined to all of the internal layers. Preferably, the external layer comprises a thermoplastic elastomer and the internal layer comprises a polyolefinic ionomer. A method and apparatus for making such a flat multi-conductor power cable is also disclosed.

29 Claims, 5 Drawing Sheets

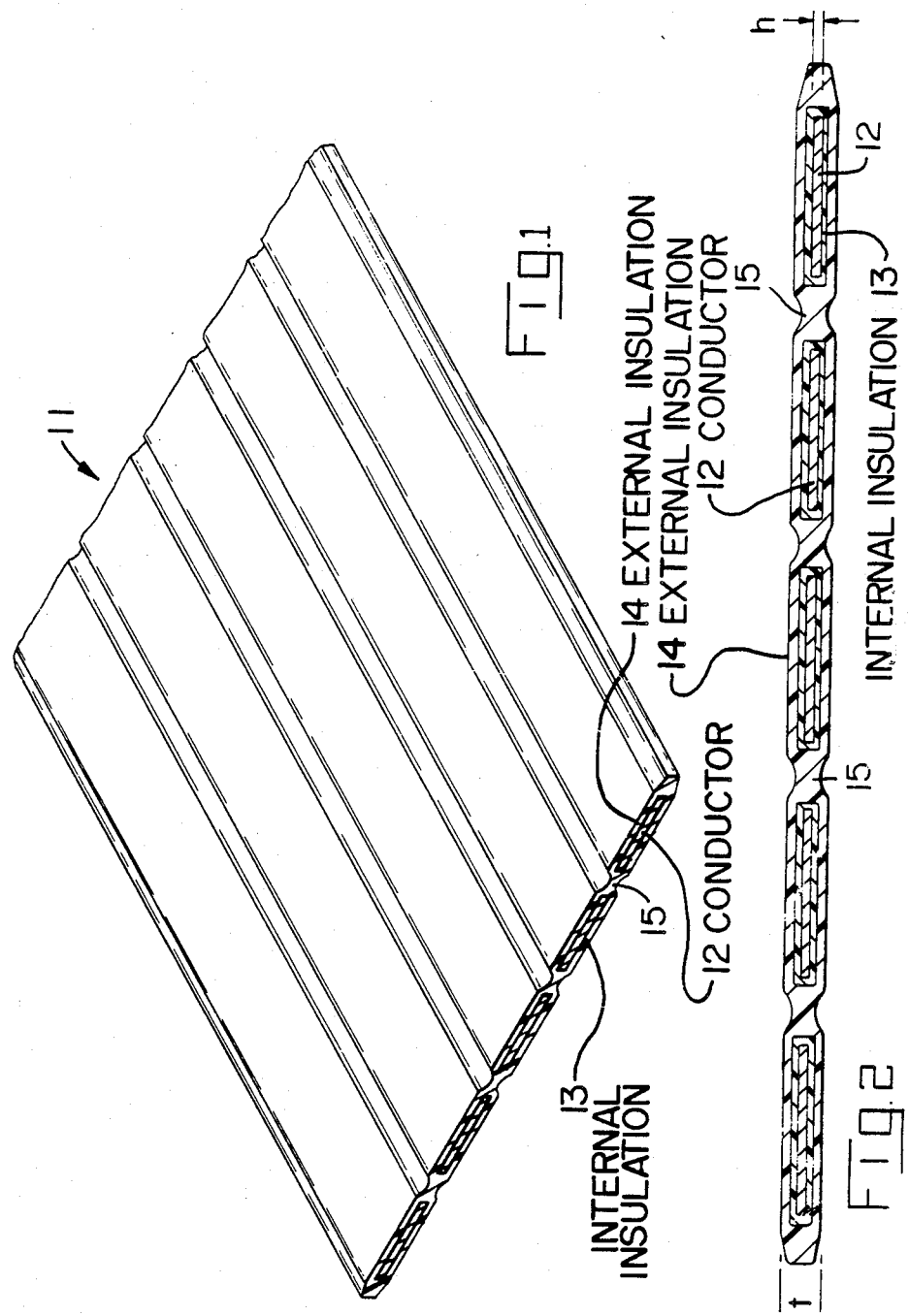

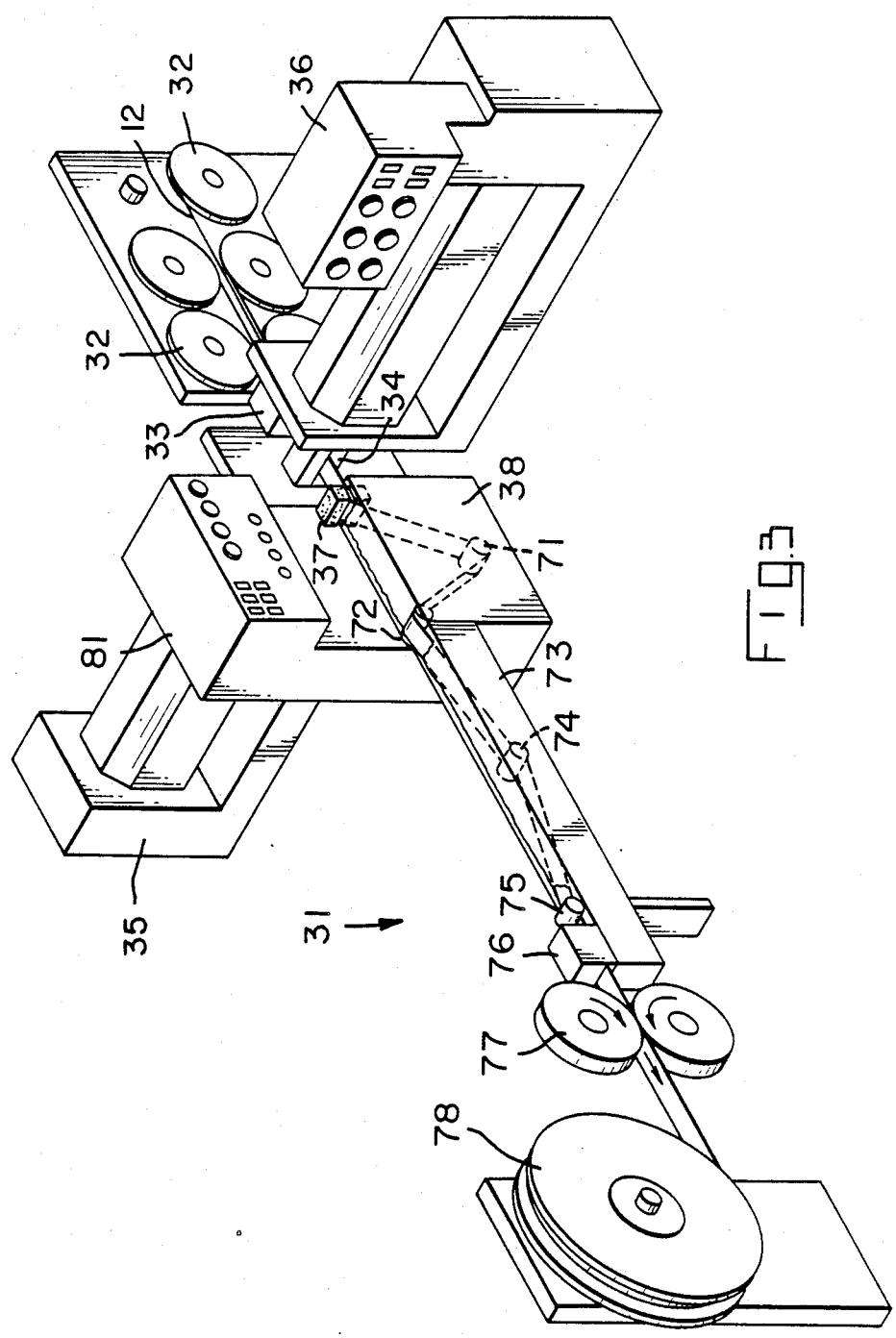

FLAT MULTI-CONDUCTOR POWER CABLE WITH TWO INSULATING LAYERS

BACKGROUND OF THE INVENTION

The present invention relates generally to multi-conductor cables for the transmission of electric power. More particularly, the present invention relates to flat multi-conductor power cables which are thin enough to be laid underneath a carpet. The present invention also relates to a method and apparatus for making such cables.

In recent years, the use of such flat power cables has become popular in certain applications. For example, flat power cable can be used to supply power to outlets which are located in the middle of a room, i.e. away from walls, by laying the flat cable under a carpet. Hence the term "undercarpet cable." Naturally, placing the power cable under the carpet is safer than running a cord across the floor. Likewise, installing undercarpet cable is more economical than installing conduits within the floor, especially when remodeling an older building.

Typically, undercarpet cable is made by laminating three or five spaced apart flat copper conductors between a top and bottom sheet of insulating material, such as a polyester. An adhesive is applied to the polyester sheets and the two sheets are then pressed onto the conductors with a certain amount of heat and pressure. Unfortunately, this lamination process is relatively slow and therefore inefficient.

Undercarpet cable is generally used in a relatively harsh environment with sever demands being made on the insulating material and the integrity of the cable. For one thing, undercarpet cable is often laid on top of a concrete floor. Concrete has a tendency to retain a certain amount of moisture which can be deleterious to the insulation layer and particularly harmful if the moisture penetrates through to the conductors. To make matters worse, the moisture emitted from concrete normally has a relatively high pH, sometimes in the order of 11 or more. Such high alkalinity can lead to erosion of certain insulating materials.

Another factor which places demands on undercarpet cable is that the cable will be subject to a certain amount of abuse caused by the traffic passing over it. In particular, when an object such as a person's foot or the wheel of a cart pushes down on the carpet above the cable, the cable may be subject to abrasion if there is relative motion between the cable and the carpet or the floor. In addition, the insulation must be resistant to penetration by particles which are pushed into the cable by the weight of an object on top of the cable. These problems are exacerbated when laying the undercarpet cable on concrete floors which normally have an abundance of particles to cause such abrasion and penetration.

Still another factor which places demands on undercarpet cable is the fact that it is made to lay horizontal and flat. As a result water is more likely to accumulate on top of the flat cable than it would on a conventional round cable which does not present a surface upon which the water can accumulate. Naturally, such accumulation could be harmful, especially if the cable had been penetrated by a particle. Accordingly, penetration resistance is even more important.

Yet another factor which places demands on undercarpet cable is the fact that, because the cable is flat, the only way to make it turn corners is to fold the cable over to thereby produce the bends needed. As a result, the cable must be amenable to folding. That is, the combination of the conductor and insulation must be relatively flexible and able to fold sharply. In addition, because such folding results in the top and bottom of the cable being reversed, both sides of the cable must be equally suited to be on the bottom and the top. In other words the abrasion resistance cannot be improved by simply putting on a thicker bottom layer of insulation. The insulation would have to be thicker on both sides since the top and bottom switch upon folding. U.S. Pat. No. 4,283,593 teaches a method of folding undercarpet cable which maintains the top and bottom as such. However, this method produces a fold which is 50% thicker than a conventional fold.

Still yet another factor which places demands on undercarpet cable is the fact that the cable cannot be too thick. That is, to avoid detection above the carpet, the cable must be relatively thin. The thickness of the conductors will have a certain minimum thickness in order to carry the desired current. As a result, the insulating layers should be as thin as possible. Naturally, this requirement of thinness conflicts with the need for abrasion and penetration resistance.

One method which has been implemented to lessen these demands on undercarpet cable has been to include a protective sheet below and above the cable when it is laid. For example, 0.25 mm sheets of polyvinyl chloride have been laid beneath and above the undercarpet cable. Sheets of galvanized steel have also been used to overlay the cable and protect it from the effects of traffic. See also U.S. Pat. No. 4,283,593 which shows an undercarpet cable which has extra metal and plastic sheaths attached directly to the cable. Naturally, either of these methods increases the cost of installing undercarpet cable. In addition, neither completely solves the problems associated with moisture.

SUMMARY OF THE INVENTION

The present invention is directed to a flat multi-conductor power cable which has two layers of insulating material surrounding the conductors. The invention is also directed to the method and apparatus for producing such a cable.

The power cable of the present invention includes a plurality of spaced apart, parallel flat conductors lying generally in the same plane. Preferably, the conductors are unitary ribbons of a metallic conductor, such as copper, and have an elongated rectangular cross-section. Each of the flat conductors is intimately joined to and surrounded by an internal layer of a first insulating material. Each internal layer is spaced apart from the other internal layers and is of relatively uniform thickness around the conductor. Preferably, this first insulating material comprises a thermoplastic polymer selected from the group consisting of polyolefinic ionomers, and ethylene vinyl acetate copolymers. In addition, an external layer of a second insulating material completely surrounds all of the internal layers. This second insulating material preferably comprises a thermoplastic polymer material and more preferably a thermoplastic elastomer such as a dynamic vulcanizate.

In the method of making such a power cable a plurality of flat conductors is provided which are arranged so as to lie generally in the same plane, generally parallel to each other, and spaced apart from each other. The flat conductors are also moved through the extruding means. In the extruding means, an internal layer of a first insulating material is extruded around each conductor, and a single external layer of a second material is extruded around all of the internal layers. The internal layers are intimately joined to and made to surround the flat conductors while the external layer is intimately joined to and made to surround the internal layers, thereby forming a flat conductor cable with two layers of insulating material.

The apparatus of the present invention includes means for arranging a plurality of flat conductors which lie generally in the same plane, generally parallel to each other, and spaced apart from each other. The apparatus also includes a first extruding means for extruding an internal layer of a first insulating material around each of the flat conductors such that said internal layers are intimately joined to and surround each of the flat conductors and are spaced apart from each other. A second extruding means is also included for extruding a single external layer around all of the internal layers such that the external layer is intimately joined to and surrounds the internal layers, thereby forming a flat power cable with two layers of insulating material. Preferably, the first and second extruding means are adjacent to one another so that the external layer of insulating material is applied immediately after the internal layer is applied. The apparatus further comprises means for moving the extruded cable through the production line.

The flat multi-conductor power cable with two layers of insulation according to the present invention provides significant advantages. In particular, through the use of one material for the external jacket and another material adjacent to the conductors, the insulation for the cable can be designed to provide superior abrasion, penetration, and chemical degradation resistance with the external jacket while yet maintaining good adherence to the conductors with the internal layers. Accordingly, the otherwise harmful effects of the harsh environment in which undercarpet cable is used can be reduced. In addition, because the internal layer is well bonded to the conductors, the cable is further protected from the effects of moisture. Furthermore, because these materials are extruded on the conductors, there is provided a more efficient method of producing undercarpet cable than the prior art lamination process.

These and other features of the present invention will be more readily understood from the following detailed description read in conjunction with the accompanying drawings.

BRIEF DESCRIPTION OF THE DRAWINGS

FIG. 1 is a perspective view of a segment of flat multiconductor power cable made according to the present invention;

FIG. 2 is an end view of the power cable shown in FIG. 1;

FIG. 3 is a perspective view of an apparatus for producing the power cable of the present invention;

DETAILED DESCRIPTION

Figure 4:
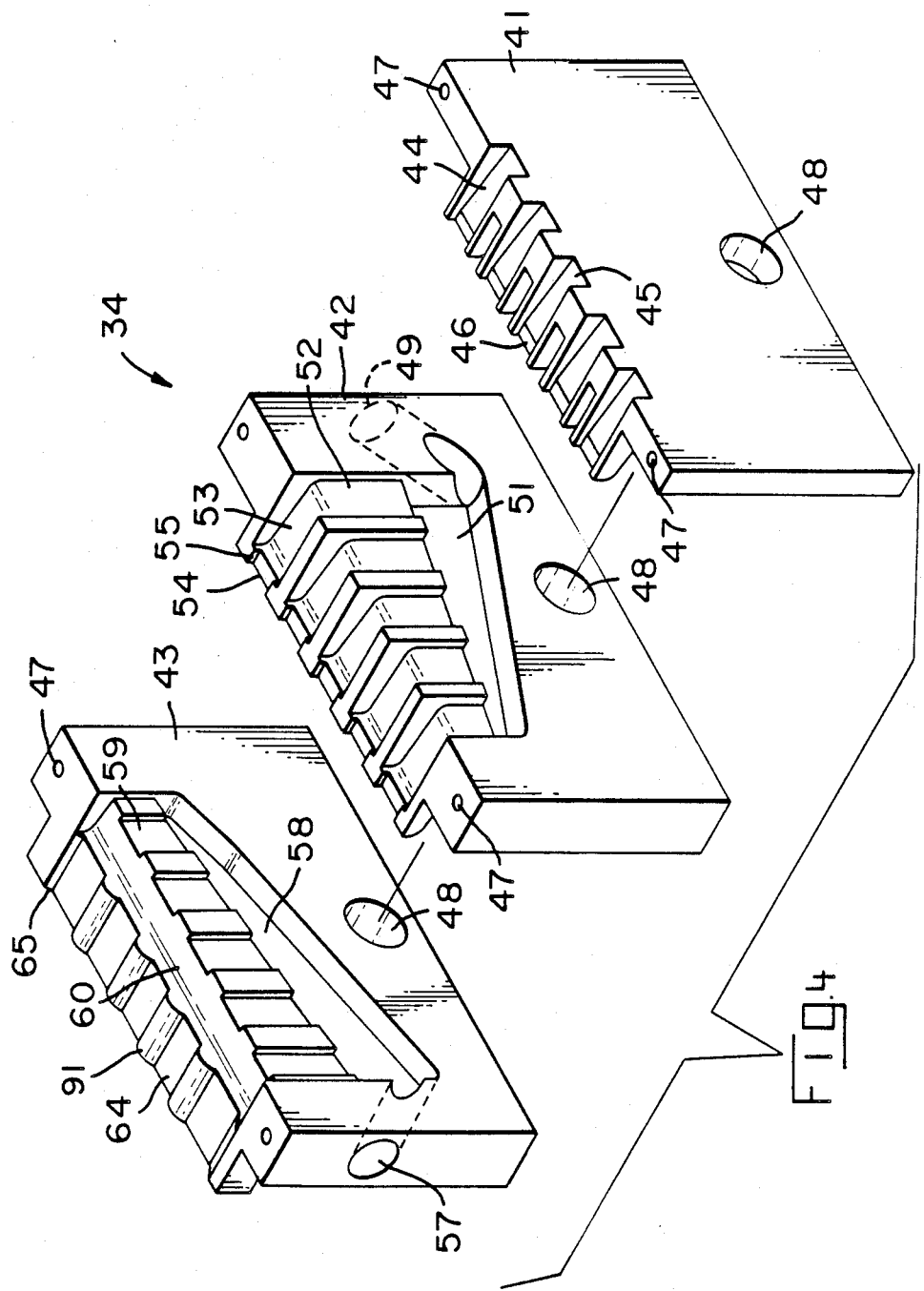
FIG. 4 is a perspective view of the three bottom pieces of the die through which the insulating layers are extruded onto the power cable of the present invention.

Referring to the drawings, FIGS. 1 and 2 show a flat multi-conductor cable made according to a preferred embodiment of the present invention. As depicted, the cable 11 comprises a plurality of flat conductors 12. The number of conductors can be varied depending on the end use for the cable. For most wiring applications, the cable will include either three or five conductors. Five are shown in this embodiment.

The material of the conductors can also be varied depending on the end use to which the cable will be put. Preferably, either copper or aluminum and their alloys will be used. Most preferably, the conductors are made from dead soft copper.

Preferably, the conductors 12 are unitary ribbons of a metallic conductor such as copper. That is, it is preferred that the conductors be in one flat piece as opposed to being comprised of many strands. As shown, the conductors in this embodiment are relatively flat and have a generally rectangular cross-section. The height h of the conductors is kept to a practical minimum in order to keep the overall thickness t of the cable as low as possible. Preferably, when the cable is intended for use at 110 volts, each of the conductors is about 0.229 mm (0.009 inches) thick and about 15.2 mm wide. At this thickness and width, and when the conductor material is a dead soft copper, the conductors will have rating of 20 amps.

These flat conductors are more difficult to cover by extrusion of an insulating material than a round conductor. In particular, flat conductors present more surface area to cover. In addition, the sharp edges provide a greater challenge in achieving uniform thickness of insulation. Applicants believe that these factors may have led those in the past to rely on lamination of insulation sheets to cover the flat conductors of undercarpet cable.

An internal layer 13 of a first insulating material surrounds each of the conductors 12. As shown, each internal layer 13 surrounds a conductor 12 completely and has a relatively uniform thickness. Accordingly, each internal layer 13 has a cross-section of generally rectangular shape. In addition, each internal layer 13 is spaced apart from the others. Each internal layer is intimately bonded to a conductor. It is important that the internal layer is intimately joined to the conductor, i.e. without gaps; as it has been found that an intimately joined internal layer can greatly reduce the damage done to the cable in the event of small punctures of the insulation. That is, if a small hole is formed through the insulation, moisture can only contact a small point on the conductor. In contrast, if there is space between the insulation and the conductor, then moisture penetrating through the small hole will contact a much larger area of the cable. This problem with a space between the insulation and the conductor is worsened by the fact that because the cable is flat and horizontal, the moisture will tend to accumulate and also be wicked in between the conductor and the insulation.

It is also important that, in addition to being intimately joined, the internal layer of insulation be well bonded to the conductor, most preferably through some form of chemical adherance. This is important because, even if the internal layer is applied to the conductors without gaps, heavy traffic over the cable could cause the internal layer to be pulled away from the conductor thereby creating gaps. Another reason for requiring a good bond between the conductor and the internal layer is the fact that it is relatively difficult to obtain good coverage of a flat conductor by extruding as opposed to obtaining coverage of a round wire. The ability of achieving uniform and complete coverage of the conductor by extrusion is improved if the extruded material will bond to the conductor. Thus, it is important to use a material for the internal layer which will form a good bond with the conductor. Typically, undercarpet cable is used with connectors which operate without having to strip the insulation. Accordingly, it is not a disadvantage for the insulation to be well bonded to the conductor.

The preferred group of materials to use in the internal layer are the ionomers, i.e. polymers with covalent bonds between the constituents of the long-chain molecules, and ionic bonds between the chains (See *Hackh's Chemical Dictionary*, 1969). The inventors have found that ionomers bond very well to metallic conductors such as copper.

The most preferred ionomer for the first insulating material is that sold by E. I. du Pont de Nemours & Co., Polymer Products Department, under the trade name "Surlyn 9450". This ionomer is characterized as an ionically linked acid copolymer having the general formula

an acid content between 5 and 10 percent, which is 15 to 25 percent neutralized; a melt index between 1 and 6; and a weight average molecular weight over 250,000 and wherein M is a metallic ion selected from the group consisting of sodium, potassium and zinc. It is the applicants' belief that materials of this type are disclosed in U.S. Pat. No. 4,248,990. "Surlyn 9450" uses zinc as a cation. Other grades of Surlyn use sodium potassium and other metals as the cation.

Alternative insulating materials such as ethylene vinly acetate may be used for the internal layer. Such materials should have the following characteristics. First, the material for the internal layer must be thermoplastic and amenable to extrusion around the conductors. Second, for the reasons stated above, it should form a good bond with the conductor. Third, because it is preferred to extrude both the internal and the external layers in a double extrusion die, the first insulating material should have an acceptable extrusion temperature which is the same or at least close to the extrusion temperature of the second insulating material. Fourth, it should have a melt temperature sufficiently high so as to pass appropriate safety standards (see the related discussion below). Fifth, it should be relatively resistant to degradation in an alkaline environment. Sixth, the material should resist migration of the conductor material into the internal layer. This last property is preferably enhanced by addition of an ion migration inhibiting agent such as 1,2-bis(3,5-di-tert-butyl-4-hydroxyhydrocinnamoyl) hydrazine, otherwise known as Irganox MD 1024 and sold by CIBA GEIGY, INC. Such an agent acts to chelate copper ions to thereby prevent them from passing through the internal layer.

Surrounding all of the internal layers 13, is an external layer or jacket 14 of a second insulating material. This external layer is intimately joined with the internal layers 13 and provides the external surface of the cable 11. As can be seen, the jacket 14 functions to maintain the position of the conductors 12 in the cable 11, particularly the separation between the conductors 12 and the internal layers 13 by the separating portions 15 of the jacket 14.

The material of the external jacket preferably comprises a thermoplastic polymeric materials, i.e. an extrudable thermoplastic elastomer. The inventors have found that using a thermoplastic elastomer improves the properties of the cable, especially the abrasion and penetration resistance. In particular, the inventors have discovered that, if the external jacket of the undercarpet cable possesses a certain amount of elasticity, particles are less likely to penetrate the insulation as compared with an insulation which is less elastic. Instead of being pushed through the insulation, particles are more likely to only be pushed into the elastic jacket material which flexes around the particle, thus avoiding the occurrence of holes through to the conductor.

Several types of thermoplastic elastomers are available, such as urethanes, styrenics and dynamic vulcanizates. Thermoplastic materials such as polyethylene and polyvinyl chloride may also be used. The dynamic vulcanizates are preferred.

A dynamic vulcanizate is a thermoplastic elastomer produced by an in-situ vulcanization process which generates fully cured rubber particles dispersed in a continuous thermoplastic matrix. See, O'Connor, G. E. and M. A. Faith "Thermoplastic Elastomers Part 1: Can TPE's Compete Against Thermoset Rubbers?" *Rubber World*, Vol. 185, No. 3, December 1981, pp. 25-29.

Most preferably, the dynamic vulcanizate for the external jacket is that sold by the Monsanto Polymer Products Company under the designation "Santoprene 453-45". This dynamic vulcanizate comprises ethylene-propylene-diene monomer (EPDM) rubber particles with an average size of 0.001 mm dispersed in a matrix of polypropylene.

The Santoprene 453-45 material has been found to perform exceptionally well as the external jacket material for the flat power cable of the present invention. In particular, the Santoprene 453-45 material has shown excellent abrasion and penetration resistance. In addition, the material extrudes well and has an acceptable extrusion temperature of about 200° C. which is equal to that preferably used with the Surlyn 9450 material.

It is important that the insulation as a whole possess a certain amount of heat and flame resistance. In particular, the cable is required to comply with safety standards relating to its ability to withstand excessive heat as well as flame. It has been found that it is desirable to employ flame retardant additives in the external jacket 14. Examples of such compounds are decabromodiphenyl oxide or 1,1a,2,2,3,3,3a,4,5,5,5s, 5b,6-dodecachloro-octahydro-1, 3,4-metheno-1H-cyclobuta [cd] pentalene, sold as "Dechlorane" by The Hooker Chemical Division of Oxidental Petroleum, Inc. Preferably these compounds are added to the extrusion melt for the external jacket.

Although the Santoprene material has been found to work well for the external jacket, the inventors have also found that it is not suitable as the sole material of the cable insulation. In particular, the inventors found that the Santoprene did not adhere well when extruded on the conductors. As a result, an intimate and strong bond between the insulation and the conductor could not be guaranteed.

As a general matter, the inventors could not find any single insulating material which satisfied all of the criteria needed to make their improved flat multi-conductor power cable, i.e. amenability to extrusion, good adherence to the conductor, penetration and abrasion resistance, flexibility, flame retardance, and high melting temperatures. In contrast, with the inventors' discovery, these criteria can be satisfied through the use of two different materials for the insulation. For example, in the most preferred embodiment, the Santoprene provides the penetration, abrasion, flame, heat, and chemical degradation resistance which is needed in the outer surface of the power cable. In addition, the Surlyn material of the most preferred embodiment provides a good sealing layer around the conductors to prevent any gaps between the insulation and the conductors and thus further protect the conductors from moisture.

The preferred dimensions of the power cable 11 are as follows. As mentioned above, the thickness of the entire cable is kept to a practical minimum, preferably between about 0.78 and 1.32 mm, and most preferably about 1.27 mm. The maximum thickness acceptable for undercarpet cable is about 2.5 mm. As mentioned above, the thickness of the conductor is preferably about 0.224 mm when the cable is made for use with 110 volts. Because the material of the internal layer 13 typically does not have the flame and heat resistance of the material in the external jacket 14, and because the internal layer is not required to provide the abrasion and penetration resistance which the external jacket is, the internal layer 13 is preferably relatively thinner than the external jacket 14. Preferably, the thickness of the internal layer is between about 0.07 and about 0.102 mm, and most preferably between about 0.076 and about 0.089 mm. This thickness should be relatively uniform on each side of the conductor. The thickness of the external jacket between the internal layer and the external surface of the cable, is preferably between about 0.178 and about 0.445 mm, and most preferably between about 0.419 and about 0.445 mm. thick.

Referring to FIG. 3 for a description of the method and apparatus of making the flat multi-conductor power cable of the present invention, a plurality of flat ribbon-like conductors 12 are provided from rolls 32. In the embodiment shown, five conductors 12 are provided. An alignment means 33 is provided which accurately arranges the conductors in the spatial relationship which they will occupy in the finished cable. In particular, the conductors are arranged so as to lie generally in the same plane, generally parallel to each other, and spaced apart from each other.

The conductors 12 next pass into the extruding die 34 where the internal layer of insulating material is applied and then the external jacket is applied. The insulating material for the internal layer is provided from the extruders 35 preferably at a pressure of between about 56.25 and about 63.28 Kg per cm$^2$ and a temperature between about 200° C. and 210° C. while the insulating material for the external jacket is provided from the extruder 36 preferably at a pressure of between about 133.6 and about 147.6 Kg per cm$^2$ and a temperature between about 200° C. and 210° C. The extruders used are conventional extruding equipment. An extruder sold by the Davis Standard Division of Crompton and Knowles Corp. of Pawcatuck, Conn. under the designation "Thermatics" is most preferred.

Figure 5:
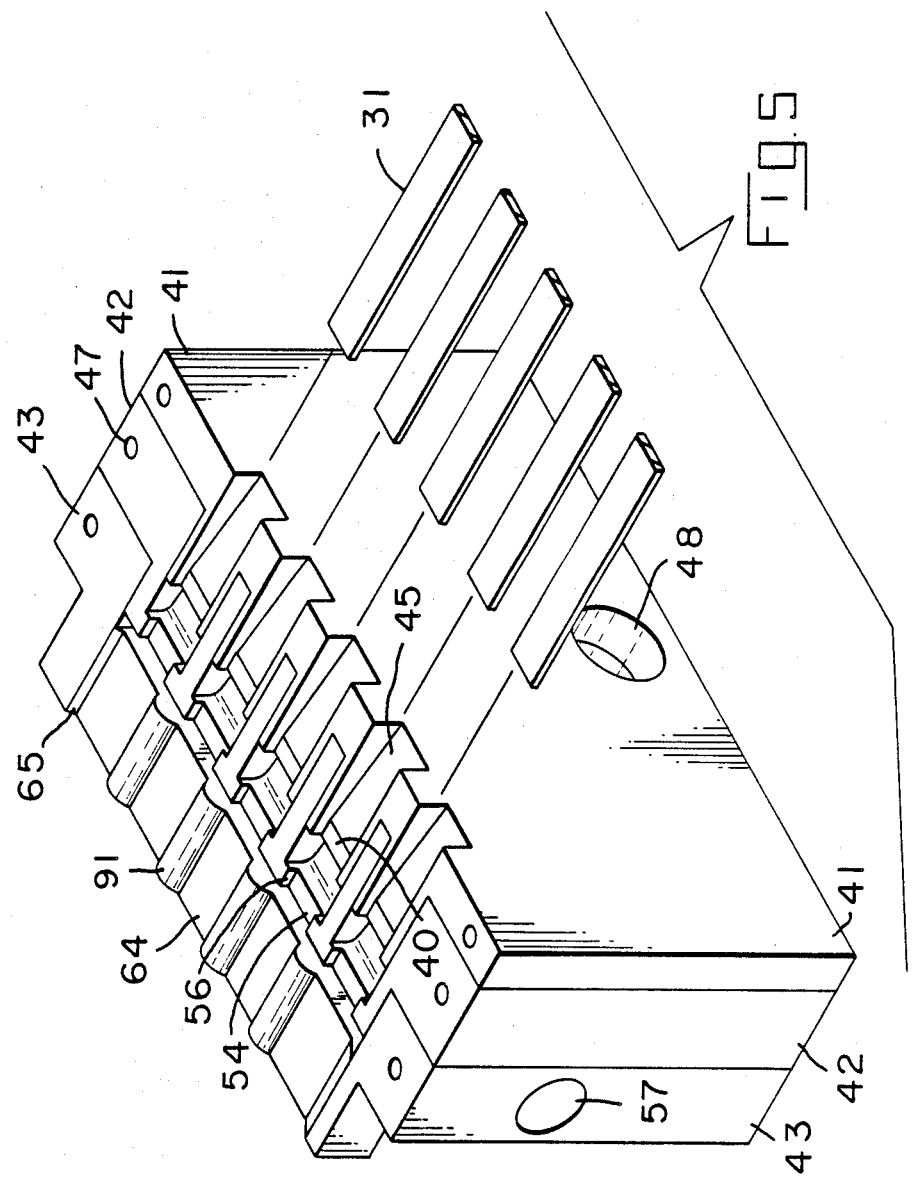
FIG. 5 shows the three pieces of FIG. 4 as assembled.
Figure 6:
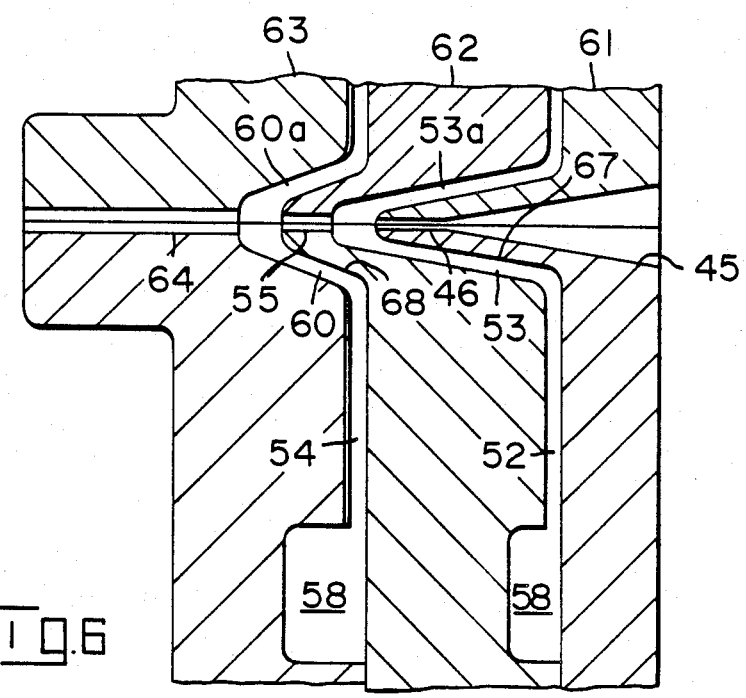
FIG. 6 is a cross-sectional view of the extrusion die used in the present invention.
Figure 7:
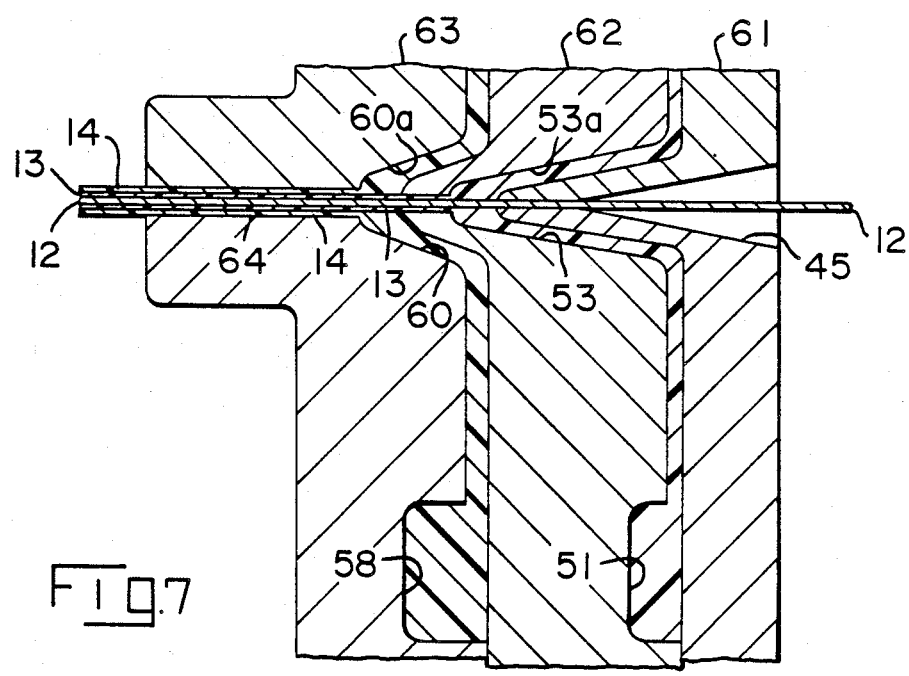
FIG. 7 is a view similar to FIG. 6 which shows the two insulating layers being extruded onto the power cable of the present invention.

For the details of the extruding die 34, reference is made to FIGS. 4, 5 and 6. FIG. 4 is a view of the three pieces, 41, 42, and 43, which make up the bottom half of the die 34. These three pieces are made to fit together as shown in FIG. 5 and are used with a mirror image set of three pieces 61, 62, and 63 (see FIG. 6) which fit together and make up the top half of the die.

The first piece 41 is used primarily to receive the conductors 12 into the die and insure their proper alignment. This is accomplished by the five channels 44 through which the conductors 12 pass. Each channel 44 consists of a sloping part 45 and a flat part 46. Indexing holes 47 and 48 are included to align this piece of the die with the others.

The second or middle piece 42 of the die is responsible for applying the internal layer of insulating material to the conductors. This piece 42 includes a port 49 through which the material melt passes into the chamber or reservoir 51. As a result of pressure being applied to the first material melt, the first material melt is pushed through the five vertical channels 52 and into the sloping 53 channels whereupon it contacts and surrounds the conductors. A similar set of channels 53a is provided in the top piece which brings the first material melt in contact with the top portion of the conductor 12. As can be seen, the rearwardly protruding surfaces 67 of the first piece 41 form the top of the sloping channels 53. The flat surfaces 54 together with the side surfaces 55 define the dimensions and the shape of the internal layers 13 on the conductors 12. The chamber 51 is sloped so as to become smaller away from the port 49 in order to obtain a relatively uniform flow of the first material melt through the channels 52 and 53.

The third or last piece 43 of the die is responsible for applying the external layer or jacket of insulating material around the internal layers. This piece 43 includes a port 57 through which the second material melt passes into the chamber or reservoir 58. Pressure is applied to the second material melt which is thereby pushed through the vertical channels 59 into the sloping single channel 60 whereupon it contacts and surrounds the internal layers 13. The rearwardly protruding surface 68 of the second piece 42 (See FIG. 6) forms the top of the sloping channel 60. Surface 64, which comprises rises 91 and sloping side surfaces 65, defines the dimensions and shape of the external layer 14. As seen in FIGS. 1 and 2, the rises 91 produce depressions in the cable 11 between the conductors 12.

In alternative embodiments, the extruding dies for the internal and external layers have a space fixed between them. In particular, depending on the material being extruded, it may be desirable to extrude the internal layer on the conductors and then allow space in the production line and thus time for that material to cool before the external jacket is applied. This may be desirable when working with a material for the external jacket which uses a melt temperature substantially below that of the material for the internal layer. In addition, it may be desirable for the internal layer to have a chance to at least partially solidify around the conductors before the external jacket is applied. However, it has been found that the materials of the most preferred embodiment work well with the near simultaneous extrusion of the two layers.

In other alternative embodiments, the conductors may be subjected to a preheating process before entering the extruding die. Heating may be accomplished by flame treatment, an inductive oven or other means known in the art. It is believed that some materials will bond to the conductors better if the conductors have been preheated to ensure clean surface and reduce the temperature difference between the conductors and extrusion materials.

A further alternative processing step includes the use of a drawing die to provide a slight radius to the edges of the conductors before they are encapsulated by the inner layer of material. The extrusion die could be modified at location 46 as shown in FIG. 6 to include this step.

Referring again to FIG. 3, after the cable 11 exits the extruding means 34 with the internal and external layers of insulating materials thereon, the cable passes between a pair of water wipes 37 and into a first water-filled cooling trough 38. The temperature of this trough is regulated so as to prevent too rapid a cool-down for the cable. When using the Santoprene and Surlyn materials of the most preferred embodiment, the temperature of the water in this first trough 38 should be kept between about 27° and about 31° C.

The cable passes under the roller 71 in the first cooling trough, over roller 72, and into the second cooling trough 73. The water in the second cooling trough is preferably colder than that in the first. In the most preferred embodiment, the water is kept between about 21 and about 27° C. The cable next passes under roller 74 and under roller 75. A blower 76 is provided in the line to quickly remove the cooling water from the cable. The cable then passes through the pulling rollers 77 and onto the take up roll 78. The pulling rollers 77 pull the cable through the production line 31. The rate of rotation of these rollers 77 is adjusted carefully so as to regulate the line speed at which the conductors 12 are coated.

Preferably, a dedicated processor 81 is provided with the production line 31 so as to monitor and regulate variables such as line speed, extrusion temperatures and pressures, etc. It is also preferable to include a cable testing means in the production line 31. In particular, a spark tester can be used as a quality control check on the soundness of the insulation. Other tests can also be incorporated.

It may also be desirable to include a printing device in the production line 31. It is common practice to label undercarpet cable with the specifications of the cable together with the manufacturer's name. This can be accomplished in the method and apparatus of the present invention by using an in-line printer. Alternatively, the cable can be printed after it is removed from the take up roll 78. Likewise, it may be desirable to incorporate an in-line splicer to splice rolls of conductor into the system so that the whole line would not have to be stopped when a roll of conductor runs out.

In an alternative embodiment, a cable is produced which is wider than will actually be used. In particular, the number of conductors fed into the production line is a multiple of the number desired for the end product. At some point after the conductors are coated, the cable is severed into the desired widths. For example, the line can be set up to coat fifteen conductors whereafter the cable is severed into either five cables with three conductors each or three cables with five conductors each. The severing could be accomplished either before the cable is wound on the take up roll, i.e. in-line, or at some point after. In this alternative embodiment, the jacket may also be perforated to facilitate severing by the installer of the cable.

The following examples are provided by way of illustration of specific embodiments of the present invention and should not be viewed as limiting the scope of the present invention.

Example 1

An apparatus such as that shown in FIGS. 2-7 was used to produce a length of flat multi-conductor cable as follows. A quantity of Surlyn 9450, obtained from Du Pont, was placed in the hopper of the first extruding means and heated to a temperature of about 205° C. The Surlyn included about 0.2 wt percent of the ion migration inhibitor Irganox MD 1024. A quantity of Santoprene 453-45, obtained from Monsanto, was placed in the hopper of the second extruding means and heated to a temperature of about 205° C. The Santoprene contained a halogenated flame retardant system, in a sufficient quantity such that injection molded plaques, 0.117" thick met the criteria for a V-O rating when tested in accordance with Underwriter Laboratory test procedure UL-94, Tests for Flamability of Plastics.

Three rolls of copper ribbon were placed on the unwind rolls. The copper ribbon was about 0.23 mm thick and 15.24 mm wide. The copper was threaded through the production line and the extruding of the first and second material begun. The first material melts were pumped at about 59 Kg per cm$^2$. The second material was pumped at about 140.6 Kg per cm$^2$. The cable was pulled through the production line at about 16.74 meters per minute. The resultant cable had an internal layer of Surlyn which was about 0.09 mm thick and an external layer of Santoprene which was about 0.43 mm thick.

Example 2

Example 2 was performed the same as Example 1 with the exception that the external layer was applied at a thickness of 0.19 mm by changing the dimensions of the third piece of the extrusion die. Everything else was held constant.

Example 3

Example 3 was performed the same as Example 1 except that the rate at which the conductors were pulled through the line was increased to 25.3 meters per minute.

Example 4

Examples 4 through 6 were performed substantially the same as Example 1-3 except that a laboratory scale extruder was used to apply the two layers of insulating material. The laboratory scale extruder was designed to extrude two materials simultaneously as described above, however, it was designed to extrude insulation on only one conductor at a time. Accordingly, the cable made according to these examples had only one conductor.

In Example 4, a 0.114 mm thick layer of EVA Copolymer was extruded onto a single flat copper conductor of the same dimensions as that in Example 1. The extrusion melt for the EVA Copolymer was 182° C. and pumped at about 51 Kg per cm$^2$. A 0.165 mm thick layer of Santoprene 453-45 was extruded over the first layer. The extrusion melt for the Santoprene 453-45 was 177° C. and pumped at about 288 Kg per cm$^2$. The conductor was pulled through the die at about 2.44 meters per minute.

Example 5

Example 5 was similar to Example 4 except that the thickness of the EVA Copolymer was 0.102 mm and the extrusion melt was 198C, pumped at about 77 kg/square centimeter. A 0.178 mm thick layer of Blane 2151 PVC was extruded over the first layer. The extrusion melt of the Blane 2151 PVC was 188C and pumped at about 225 Kg/square centimeter.

Test Procedures

The power cable produced by the above examples was subjected to the following tests: a flammability determination, a peel strength determination, and an accelerated alkaline soak resistance determination.

The procedure followed in the flammability determination is that referred to in the Underwriter's Laboratory publication UL-83 "Thermoplastic-Insulated Wires and Cables" paragraph 42. The "All-Wires Flame Test" is conducted as described in paragraph 1140.1 of UL 1581, "Reference Standard for Electrical Wires, Cables, and Flexible Cords." Briefly, the test involves contacting a length of the cable with a calibrated flame for a specific time. The time that it takes the cable to stop burning after the flame is removed is recorded. The cable is then contacted by the flame four more times.

The peel strength determination was carried out as follows. A length of the cable was cut so as to include only one conductor. Next, with a sharp knife, the insulation on the sides, i.e. the thin sides, of the conductor were stripped away. A 1 to 1.5 inch piece of insulation was manually pulled away. The manually stripped piece was placed in the upper jaw of a Monsanto T-500 Tensometer while the exposed piece was placed in the lower jaw. Naturally, to test the peel strength between the internal layer and the conductor, the internal and external layers were manuallly peeled together. Likewise, to test the peel strength between the internal and external layers, only the external layer was manually peeled. The tensometer was activated at a separation rate of 1 inch per minute. The peel strength values (i.e. the force needed to separate the two materials) were recorded on a strip chart driven at 2 inches per minute. The test was continued until the value leveled off. That value was then divided by the width of the copper (1.52 cm) to obtain the peel strength in grams per centimeter.

The accelerated alkaline soak resistance determination was performed by placing samples of cable in a heated alkaline solution and measuring the leakage current. The alkaline solution is made with NaCl, Triton X-100 surfactant, and the soluble portion of a commercially available concrete mix. The pH of the solution is maintained between 11.8 and 12.2 by the addition of sodium hydroxide as needed. The temperature of the solution is maintained at about 93° C. Three samples of cable are placed in the tank so that the ends are out of the solution and the midsection is bent and dips down into it. 240 volts were maintained across each cable. The leakage current is measured and recorded at daily intervals for several days. When the leakage reaches 1/16 of an amp, the circuit will blow, providing a preliminary sign of failure. Otherwise, the leakage current is monitored for at least 21 days.

The following table summarizes the results of these three tests performed on the above described examples.

| Ex. No. | QUALIFICATION TEST | | |
|---|---|---|---|
| | UL83 | Peel | Soak |
| 1 | Pass | From Cu[1] Inseparable From Tie[2] 64.3 g/cm | 240 hrs. |
| 2 | Pass | From Cu Inseparable From Tie 35.7 g/cm | 15 hrs. |
| 3 | Pass | From Cu From Tie | — |
| 4 | Marginal[3] Fail | From Cu 142.9 g/cm From Tie Inseparable | 115 hrs. |
| 5 | Pass | From Cu Inseparable From Tie 46.4 g/cm | — |

1. Peel strength between internal layer and copper.
2. Peel strength between internal and external layers of insulation.
3. This sample had a thinner layer of Santoprene 453-45 and a thicker layer of EVA than the previous examples. Furthermore, the prototype process creates a situation where there is excess Tie layer at the edges of the copper. It is believed these factors led to the marginal failure of the combination in the UL83 flame test. Experience has shown that the multiple conductor configuration passes the UL83 test when the sindle conductor prototype is marginal.

Thus, a flat multi-conductor power calbe has been provided. In particular, the power cable of the present invention is thin enough to be laid under a carpet and yet provides sufficient abrasion, penetration, flame, heat, and chemical degradation resistance for the cable to survive in this relatively harsh environment. Through the use of two materials in the cable's insulation, these properties have been maximized. Furthermore, the use of two materials allow for the production of flat power cable by the extrusion of the two layers upon the conductors.

While only specific embodiments and examples have been described, it should be understood that various changes anad modifications to these will be apparent to those skilled in the art. For example, although the present invention has been described in connection undercarpet cables, it may also find use in other applications where flatness is a desired property. Such changes and modifications can be made without departing from the spirit and scope of the present invention and without diminishing its attendant advantages. It is therefore intended that such changes and modifications be covered by the following claims.

What is claimed is:

1. A flat multi-conductor power cable comprising:
   a plurality of continuous, generally parallel, spaced apart metal conductors having flat upper and lower surfaces and generally lie in the same plane;
   an internal layer of a first insulating material extruded around each of said flat conductors, said internal layer being intimately joined to and completely surrounding each of said conductors and extending continuously therealong, said first material being selected to have the property of adhesively joining to the metal of flat conductors; and
   an external layer of a second insulating material extruded around said first insulating layer, said external layer being intimately joined to and completely surrounding all of the internal layers and extending continuously therealong, said second insulating material being selected to have the properties of being moisture resistant and of being intimately joined to the first material, said second insulating material being a thermoplastic vulcanizate comprising rubber particles dispersed in a continuous matrix of a thermoplastic resin; whereby said cable is especially adapted to be used in undercarpet applications.

2. The cable of claim 1 wherein said first insulating material comprises a thermoplastic polymer selected from the group consisting of polyolefinic ionomers, and ethylene vinylacetate copolymers.

3. The cable of claim 2 wherein the first insulating material is an ionically linked acid copolymer.

4. The cable of claim 2 wherein the first insulating material is an ionomer having the general formula $$[(CH_2-CH_2)_y(CH_2CCH_3COO-M^+)_x]_n;$$

an acid content between 5 and 10 percent, which is 15 to 25 percent neutralized; a melt index between 1 and 6; and a weight average molecular weight over 250,000 and wherein M is a metallic ion selected from the group consisting of sodium, potassium, and zinc.

5. The cable of claim 1 wherein the first insulating material is an ionically linked acid copolymer.

6. The cable of claim 1 wherein the first insulating material is a polyolefinic ionomer having the general formula $$[(CH_2-CH_2)_y(CH_2CCH_3COO-M^+)_x]_n;$$

an acid content between 5 and 10 percent, which is 15 to 25 percent neutralized; a melt index between 1 and 6; and a weight average molecular weight over 250,000 and wherein M is a metallic ion selected from the group consisting of sodium, potassium, and zinc.

7. A method for making a flat multi-conductor power cable comprising:
   providing a plurality of continuous, generally parallel, spaced apart metal conductors having flat upper and lower surfaces and generally lie in the same plane;
   moving said flat conductors through extruding means;
   extruding an internal layer of a first insulating material directly onto each flat conductor, said internal layers being intimately joined to and made to surround each flat conductors and extending continuously therealong, said first material being selected to have the property of adhesively joining to the metal of said flat conductors; and
   extruding a single external layer of a second insulating material around all of the internal layers, the external layer being intimately joined to the internal layers and extending continuously therealong, said second insulating material being selected to have the properties of being moisture resistant and of being intimately joined to the first material, said second insulating material being a thermoplastic vulcanizate comprising rubber particles dispersed in a continuous matrix of a thermoplastic resin.

8. The method of claim 7 wherein said first insulating material comprises a polymer selected from the group consisting of polyolefinic ionomers, and ethylene vinylacetate copolymers.

9. The method of claim 8 wherein the first insulating material is an ionically linked acid copolymer.

10. The method of claim 8 wherein the first insulating material is an ionomer having the general formula $$[(CH_2-CH_2)_y(CH_2CCH_3COO-M^+)_x]_n;$$

and acid content between 5 and 10 percent, which is 15 to 25 percent neutralized; a melt index between 1 and 6; and a weight average molecular weight over 250,000 and wherein M is a metallic ion selected from the group consisting of sodium, potassium and zinc.

11. The method of claim 7 wherein the first insulating material is an ionically linked acid copolymer.

12. The method of claim 7 wherein the first insulating material is a polyolefinic ionomer having the general formula $$[(CH_2-CH_2)_y(CH_2CCH_3COO-M^+)_x]_n;$$

an acid content between 5 and 10 percent, which is 15 to 25 percent neutralized; a melt index between 1 and 6; and a weight average molecular weight over 250,000 and wherein M is a metallic ion selected from the group consisting of sodium, potassium and zinc.

13. A flat multi-conductor power cable having live, neutral and ground conductors comprising;
   a plurality of continuous, generally parallel, spaced apart metal conductors having flat upper and lower surfaces and generally lying in the same plane, said conductors defining live, neutral and ground conductors;
   an internal layer of a first insulating material extruded around each of said live, neutral and ground conductors, said internal layer being intimately joined to and completely surrounding each of said conductors and extending continuously therealong, said first material being selected to have the property of adhesively joining to the metal of flat conductors; and
   an external layer of a second insulating material extruded around said first insulating layer, said external layer being intimately joined to and completely surrounding all of the internal layers and extending continuously therealong, said second insulating material being selected to have the properties of being moisture resistant and of being intimately joined to the first material, said second insulating material being a thermoplastic vulcanizate comprising rubber particles dispersed in a continuous matrix of a thermoplastic resin; whereby said cable is especially adapted to be used in undercarpet applications.

14. The cable of claim 13 wherein said first insulating material comprises a thermoplastic polymer selected from the group consisting of polyolefinic ionomers, and ethylene vinyl acetate copolymers.

15. The cable of claim 14 wherein the first insulating material is an ionically linked acid copolymer.

16. The cable of claim 14 wherein the first insulating material is a polyolefinic ionomer having the general formula $$[(CH_2-CH_2)_y(CH_2CCH_3COO-M^+)_x]_n;$$

an acid content between 5 and 10 percent, which is 15 to 25 percent neutralized; a melt index between 1 and 6; and a weight average molecular weight over 250,000 and wherein M is a metallic ion selected from the group consisting of sodium, potassium and zinc.

17. The cable of claim 13 wherein the first insulating material is an ionically linked acid copolymer.

18. The cable of claim 13 wherein the first insulating material is a polyolefinic ionomer having the general formula $$[(CH_2-CH_2)_y(CH_2CCH_3COO-M^+)_x]_n;$$

an acid content between 5 and 10 percent, which is 15 to 25 percent neutralized; a melt index between 1 and 6; and a weight average molecular weight over 250,000 and wherein M is a metallic ion selected from the group consisting of sodium, potassium and zinc.

19. The cable of claim 13 wherein each of the flat conductors is a unitary ribbon of a metallic conductor.

20. The cable of claim 13 wherein the maximum thickness of the cable is between about 0.78 and about 1.32 mm, the thickness of the internal layer is between about 0.07 and about 0.102 mm, and the thickness of the external layer is between about 0.178 and about 0.445 mm.

21. A method for making a flat multi-conductor power cable having live, neutral and ground conductors comprising:
providing a plurality of continuous, generally parallel, spaced apart metal conductors having flat upper and lower surfaces and generally lying in the same plane, said conductors defining live, neutral and ground conductors;
moving said flat conductors through extruding means;
extruding an internal layer of a first insulating material directly onto each live, neutral and ground conductor, said internal layers being intimately joined to and made to surround each flat conductors and extending continuously therealong, said first material being selected to have the property of adhesively joining to the metal of said flat conductors; and
extruding a single external layer of a second insulating material around all of the internal layers, the external layer being intimately joined to the internal layers and extending continuously therealong, said second insulating material being selected to have the properties of being moisture resistant and of being intimately joined to the first material, said second insulating material being a thermoplastic vulcanizate comprising rubber particles dispersed in a continuous matrix of a thermoplastic resin.

22. The method of claim 21 wherein said first insulating material comprises a polymer selected from the group consisting of polyolefinic ionomers, and ethylene vinyl acetate copolymers.

23. The method of claim 22 wherein the first insulating material is an ionically linked acid copolymer.

24. The method of claim 22 wherein the first insulating material is a polyolefinic ionomer having the general formula $$[(CH_2-CH_2)_y(CH_2CCH_3COO-M^+)_x]_n;$$

an acid content between 5 and 10 percent, which is 15 to 25 percent neutralized; a melt index between 1 and 6; and a weight average molecular weight over 250,000 and wherein M is a metallic ion selected from the group consisting of sodium, potassium and zinc.

25. The method of claim 21 wherein the first insulating material is an ionically linked acid copolymer.

26. The method of claim 21 wherein the first insulating material is a polyolefinic ionomer having the general formula $$[(CH_2-CH_2)_y(CH_2CCH_3COO-M^+)_x]_n;$$

an acid content between 5 and 10 percent, which is 15 to 25 percent neutralized; a melt index between 1 and 6; and a weight average molecular weight over 250,000 and wherein M is a metallic ion selected from the group consisting of sodium, potassium and zinc.

27. The method of claim 21 wherein each of the flat conductors is a unitary ribbon of a metallic conductor.

28. The method of claim 21 wherein the maximum thickness of the cable is between 0.78 and 1.32 mm.

29. The method of claim 21 wherein said first and second insulating layers are extruded nearly simultaneously.

* * * * *